United States Patent
Yasui et al.

(10) Patent No.: US 7,199,022 B2
(45) Date of Patent: Apr. 3, 2007

(54) MANUFACTURING METHOD OF SEMICONDUCTOR DEVICE

(75) Inventors: Kan Yasui, Kodaira (JP); Toshiyuki Mine, Fussa (JP); Yasushi Goto, Kokubunji (JP); Natsuki Yokoyama, Mitaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/814,627

(22) Filed: Apr. 1, 2004

(65) Prior Publication Data

US 2004/0198019 A1    Oct. 7, 2004

(30) Foreign Application Priority Data

Apr. 2, 2003    (JP)    ............... 2003-098994

(51) Int. Cl.
*H01L 21/76*    (2006.01)
(52) U.S. Cl. .................. 438/437; 438/772; 438/773; 438/907
(58) Field of Classification Search .......... 438/424, 438/431, 435, 437, 770–774, 907
See application file for complete search history.

(56) References Cited

U.S. PATENT DOCUMENTS

| | | | |
|---|---|---|---|
| 6,410,456 B1 | 6/2002 | Gronet et al. | 43/769 |
| 6,551,925 B2 | 4/2003 | Iguchi et al. | 438/637 |
| 6,596,607 B2 | 7/2003 | Ahn | 438/424 |
| 2002/0072198 A1* | 6/2002 | Ahn | 438/424 |
| 2002/0168873 A1* | 11/2002 | Ahn et al. | 438/781 |

FOREIGN PATENT DOCUMENTS

| | | |
|---|---|---|
| JP | 2002-43408 | 2/2002 |
| JP | 2002-203895 | 7/2002 |

* cited by examiner

*Primary Examiner*—M. Wilczewski
*Assistant Examiner*—Toniae M. Thomas
(74) *Attorney, Agent, or Firm*—Miles & Stockbridge PC

(57) ABSTRACT

In order to achieve an isolation trench formation process according to the present invention in which the structure of a silicon nitride film liner can be easily controlled and to allow both of reduction of the device feature length and reduction in stress occurring in an isolation trench, the silicon nitride film liner is first deposited on the inner wall of the trench formed on a silicon substrate. The upper surface of a first embedded insulator film for filling the inside of the trench is recessed downward so as to expose an upper end portion of the silicon nitride film liner. Next, the exposed portion of the silicon nitride film liner is converted into non-silicon-nitride type insulator film, such as a silicon oxide film. A second embedded insulator film is then deposited on the upper portion of the first embedded insulator film, and the deposited surface is then planarized.

8 Claims, 22 Drawing Sheets

FIG.22
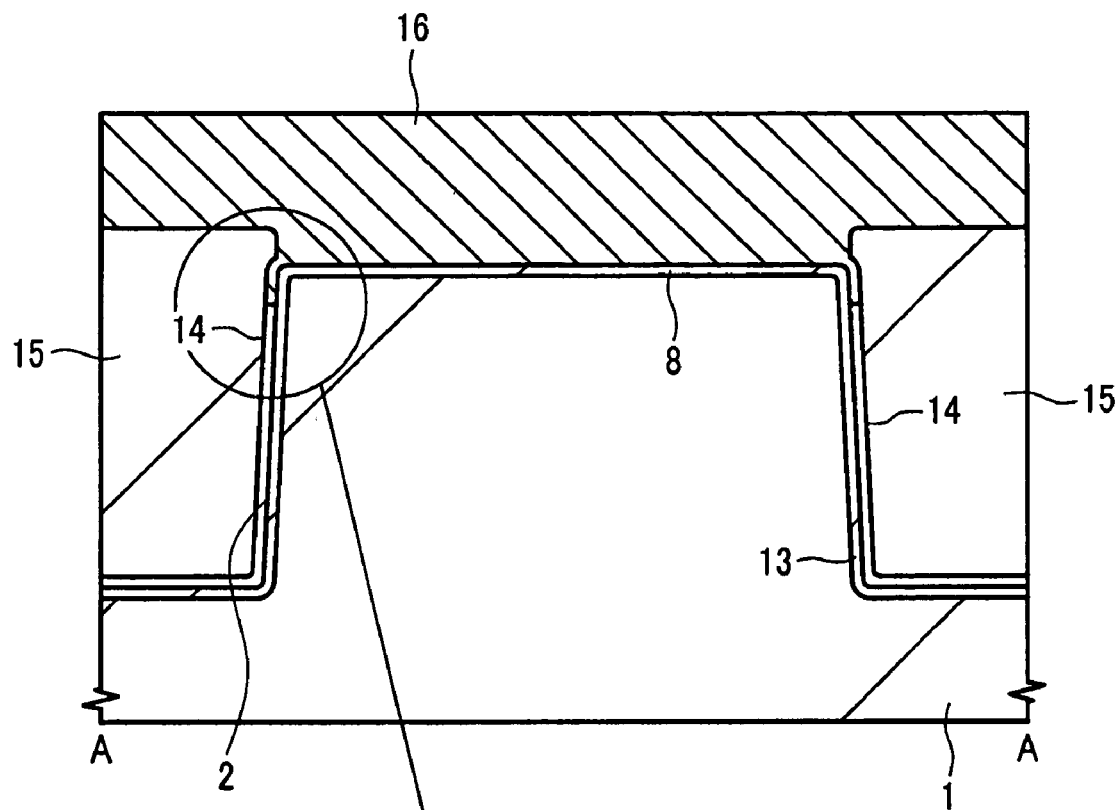
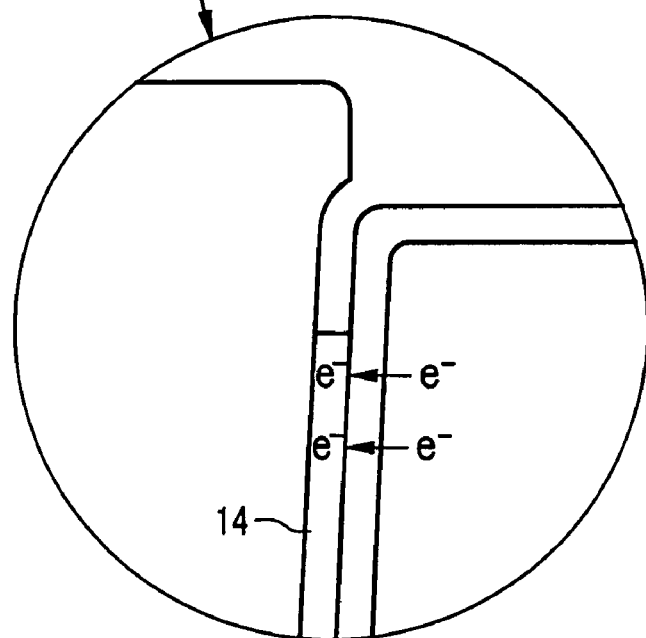

MANUFACTURING METHOD OF SEMICONDUCTOR DEVICE

CROSS-REFERENCE TO RELATED APPLICATIONS

The present application claims priority from Japanese Paten Application No. JP2003-98994 filed on Apr. 2, 2003, the content of which is hereby incorporated by reference into this application.

TECHNICAL FIELD OF THE INVENTION

The present invention relates to a semiconductor device manufacturing technology, and more specifically, to a technique effectively applicable to formation of an isolation trench having a silicon nitride film liner.

BACKGROUND OF THE INVENTION

In order to achieve highly integrated, high-performance semiconductor integrated circuits, their dimension has been repeatedly reduced. Also, as for the methods of electric isolation between devices, in place of the method of the Local Oxidation of Silicon (LOCOS) accompanied by a dimensional loss caused by oxidation called a bird's beak, the Shallow Trench Isolation (STI) method suitable for micro-fabrication has been used from a generation of 0.35 μm design rule. In the STI method, silicon oxide film serving as insulator is embedded inside shallow trenches formed on a silicon substrate. This method does not raise a problem of a bird's beak. Furthermore, even if an isolation width gets smaller to the order of 0.1 μm, necessary electrical isolation can be obtained.

The above STI method, however, has the following three problems: (1) Stress, (2) Recess, and (3) Embedding in a microscopic trench.

(1) Stresses caused by shallow trench isolation include a stress caused by a difference between a thermal expansion coefficient of a silicon oxide film in the trench and that of a silicon substrate and a stress caused by oxidation of the inner wall of the trench accompanied by volume expansion in an oxidation process after embedding the trench. In particular, the stress associated with oxidation of the trench's inner wall has a large effect. Moreover, since the area of the inner wall of the shallow trench is increased with the reduction of the device feature length, the stress caused by oxidation is also increased with the reduction of the device feature length, causing problems such as a crystal defect and junction leakage.

(2) A recess is formed in a subsequent hydrofluoric acid cleaning process in which a boundary portion between the silicon oxide film and the silicon substrate exposed on the surface of the shallow trench is excessively removed to be recessed. Then, when a polysilicon film, which is a gate electrode material, is deposited on the upper surface of this recess, the polysilicon film in the recess intensifies the gate electric field. As a result, a deterioration called a hump or kink occurs in transistor characteristics. Moreover, the polysilicon film in the recess may be left unremoved during etching at the time of gate processing, thereby possibly causing an electrical short defect.

(3) Embedding a silicon oxide film inside the shallow trench becomes difficult with the advance of device scaling. That is, even if the width of the trench is reduced with the device scaling, the trench is required to have a prescribed depth in order to keep its insulation. As a result, its aspect ratio is increased, thereby making it difficult to fill the trench with the silicon oxide film by the Chemical Vapor Deposition (CVD) method.

A measure that has been applied in order to get around the above stress problem is that a thin silicon nitride film called a silicon nitride film liner is laid on the inner wall of the shallow trench (refer to Japanese Patent Application Laid-Open No. 2002-43408, corresponding U.S. Pat. No. 6,551,925, for example). This measure utilizes a property of the silicon nitride film of not allowing oxidizing species, such as water, to pass. A thin silicon nitride film is disposed on the inner wall of the shallow trench, thereby preventing oxidation of the inner wall and suppressing the occurrence of stress in the subsequent processes.

A shallow trench isolation process using the above silicon nitride film liner is described below with reference to FIGS. 14 through 20 of this application. First, as illustrated in FIG. 14, a pad oxide film 11 is grown on a silicon substrate 1 as a protective film, and then a silicon nitride film 12 for masking is further deposited on the pad oxide film 11.

Next, as illustrated in FIG. 15, dry etching with a photoresist film (not shown) being used as a mask is performed to form a shallow trench 2a on the silicon substrate 1. Then, in order to remove etching damages remaining on the inner wall of the trench 2a, the inner wall of the trench 2a is oxidized to form a thin silicon oxide film 30.

Next, wet etching is performed on the inner wall of the trench 2a to remove the silicon oxide film 30. As illustrated in FIG. 16, the inner wall of the trench 2a is then oxidized again to form a thin silicon oxide film 13. Subsequently, a silicon nitride film liner 14 is deposited on the silicon substrate 1 by the CVD method.

Next, as illustrated in FIG. 17, a silicon oxide film 15 having a film thickness thicker than the depth of the trench 2a is deposited on the silicon substrate 1 by the CVD method. Then, as illustrated in FIG. 18, the Chemical Mechanical Polishing (CMP) method is employed to remove a portion of the silicon oxide film 15 outside the trench 2a so as to planarize the silicon oxide film 15.

Next, as illustrated in FIG. 19, the silicon nitride film 12 used as a mask against oxidation is selectively removed by using hot phosphoric acid, thereby completing an isolation trench 2. As illustrated in FIG. 20, a gate insulator film 8 comprised of a silicon oxide film or the like is then formed on the surface of the silicon substrate 1, and a gate electrode 16 comprised of a polysilicon film or the like is further formed thereon.

The above shallow trench formation process for forming the silicon nitride film liner 14 is effective to solve the above-mentioned stress problem. However, in the process of removing the silicon nitride film 12 with hot phosphoric acid (FIG. 19), the upper end portion of the silicon nitride film liner 14 is also removed. Therefore, the problem of the occurrence of recesses on the surface of the isolation trench 2 (portions each surrounded by a circle in FIG. 20) yet remains. Moreover, the aspect ratio of the isolation trench 2 is increased by the film thickness of the silicon nitride film liner 14. This does not solve the problem of making it difficult to fill the isolation trench 2 with the silicon oxide film, either.

Furthermore, laying the silicon nitride film liner 14 on the inner wall of the isolation trench 2 poses a new problem that a threshold voltage is shifted, which is described below with reference to FIGS. 21 and 22. FIG. 21 is a plane view of a silicon substrate 1 having a MOS transistor formed thereon, and FIG. 22 is a section view of the silicon substrate along an A—A line shown in FIG. 21.

The silicon substrate 1 has formed thereon an isolation trench 2 so as to surround an active area 9. The active area 9 has formed thereon a gate electrode 16, both end portions of which go across boundary portions between the active area 9 and the isolation trench 2. As illustrated in FIG. 22, in an area where the silicon nitride film liner 14 formed on the inner wall of the isolation trench 2 and the gate electrode 16 overlap with each other, carriers flowing through the silicon substrate 1 (channel) under the gate electrode 16 approach the silicon nitride film liner 14. Therefore, a phenomenon occurs in which these carriers are trapped in the silicon nitride film liner 14 due to a hot carrier effect, thereby causing an undesired shift in threshold voltage in the MOS transistor.

In order to get around the above-mentioned problem of the shift in threshold voltage, a method disclosed in Japanese Patent Application Laid-Open No. 2002-203895 (corresponding U.S. Pat. No. 6,596,607) is described below with reference to FIGS. 23 through 28.

This method is not different from the above-described shallow trench formation process up to a step of depositing the silicon nitride film liner 14 on the inner wall of the trench 2a formed on the silicon substrate 1 (FIG. 23). Next, a process of embedding an insulator film inside the trench 2a is performed, which is divided into two steps.

In the first step, as illustrated in FIG. 24, the CVD method or the Spin on Glass (SOG) method is employed to fill the trench 2a with an insulator film 31, such as a silicon oxide film or a film analogous thereto. Wet etching is then used to remove the upper portion of the film so as not to completely fill the inside. Subsequently, isotropic etching is performed on a portion of the insulator film 31 outside the trench 2a, thereby recessing the upper surface of the insulator film 31 embedded inside the trench 2a downward from the surface of the silicon substrate 1. At this time, the silicon nitride film liner 14 is exposed on the upper end portions of the side wall of the trench 2a.

Next, as illustrated in FIG. 25, the exposed portions of the silicon nitride film liner 14 are selectively removed by wet etching with hot phosphoric acid. With this, the upper end portions of the silicon nitride film liner 14 are recessed downward from the upper surface of the insulator film 31.

Next, as illustrated in FIG. 26, an insulator film 32, such as a silicon oxide film or a film analogous thereto, is embedded to the extent where the inside of the trench 2a is completely filled. The CMP method is then employed to remove a portion of the insulator film 32 outside the trench 2a so as to planarize the insulator film 32.

Next, as illustrated in FIG. 27, the silicon nitride film 12 used as a mask against oxidation is selectively removed with hot phosphoric acid to complete the element isolation trench 2. As illustrated in FIG. 28, a gate insulator film 8 comprised of a silicon oxide film or the like is then formed on the surface of the silicon substrate 1, and a gate electrode 16 comprised of a polysilicon film or the like is further formed thereon.

In the above-described shallow trench formation process, the silicon nitride film liner 14 in the upper end portions of the isolation trench 2 are removed. Therefore, the above-described problem of the shift in threshold voltage can be avoided. Also, the process of embedding the insulator films 31 and 32 inside the trench 2a is performed in two steps. This makes the embedding process easy even if the aspect ratio of the trench 2a is high.

In the above-described shallow trench formation process, however, wet etching with hot phosphoric acid is employed to recess the upper end portions of the silicon nitride film liner 14 downward from the upper surface of the insulator film 31. Therefore, etchant remains in step-like portions occurring between the silicon nitride film liner 14 and the insulator film 31 (portions each surrounded by a circle in FIG. 25), causing microvoid defects in the above step-like portions when the insulator film 32 is deposited on the upper portion of the insulator film 31. As a result, when the surface of the insulator film 32 is etched to cause recesses in the subsequent cleaning process, as illustrated in FIG. 28, the recesses and void defects thereunder may be joined together, thereby causing a large recess 33.

In order to prevent the occurrence of the above recess 33 and ensure a margin in wet etching of low controllability, one method that can be taken is to excessively remove the silicon nitride film liner 14. With this, however, a stress occurs at the time of oxidization at a place on the side wall of the isolation trench 2 where the silicon nitride film liner 14 has been removed. Therefore, the effect of forming the silicon nitride film liner 14 cannot be obtained.

Moreover, an isotropic dry etching can be employed in place of wet etching to recess the silicon nitride film liner 14. With this, however, damages caused by etching remain on the side wall of the isolation trench 2.

The shallow trench isolation process has the above-described problems, such as the stress, the recess, embedding of a insulator film in a fine trench, and a shift in threshold voltage. Even in the above described art for solving these problems, stress suppression and recess control have yet a trade-off relation.

SUMMARY OF THE INVENTION

Therefore, an object of the present invention is to provide a technology for achieving an isolation trench formation process in which the structure of a silicon nitride film liner can be easily controlled and for allowing element microfabrication and reduction in stress occurring in an isolation trench.

These and other objects, features, aspects and advantages of the present invention will become more apparent from the following detailed description of the present invention when taken in conjunction with the accompanying drawings.

The typical ones of the inventions disclosed in this application will be briefly described as follows.

In order to attain the object mentioned above, in a shallow trench isolation process, a shallow trench is formed on a silicon substrate by etching. The method of the present invention includes the steps of: forming a silicon nitride film liner on an inner wall of the shallow trench; filling the trench with a first embedded film; removing an upper portion of the first embedded film to expose the silicon nitride film liner; converting the exposed silicon nitride film liner; and filling the trench with a second embedded film.

Prior to the step of forming the silicon nitride film liner, a step of forming a silicon oxide film for achieving an excellent interface of the inner wall of the shallow trench can be included.

In the step of converting the exposed silicon nitride film liner, the silicon nitride film is converted to a silicon oxide film which is resistant to being removed by wet etching with hot phosphoric acid.

Also, in the step of converting the silicon nitride film liner to the silicon oxide film, the In situ Steam Generation (ISSG) oxidation disclosed in U.S. Pat. No. 6,410,456 is preferably employed.

In the step of removing the first embedded film which determines the amount of conversion of the upper portion of the silicon nitride film liner, it is preferable that the upper end portion of the silicon nitride film liner is positioned lower than a channel depth of a MOS transistor and be close to an upper portion of the shallow trench. In particular, in a case of a p-channel MOS transistor, the upper end of the silicon nitride film liner is preferably positioned at a lower place of the channel.

Also, the process of converting the silicon nitride film and the process of filling the trench with the second embedded film can be successively performed by the same apparatus.

As at least one of the first and second embedded films, an SOG film, which is easy to be embedded in a fine trench, can be used. In particular, a polysilazane-type SOG film having a high heat-resistant property is suitable.

BRIEF DESCRIPTION OF THE DRAWINGS

FIG. 22 is a section view of the silicon substrate along an A–A' line shown in FIG. 21.

DESCRIPTION OF THE PREFERRED EMBODIMENTS

Figure 1:
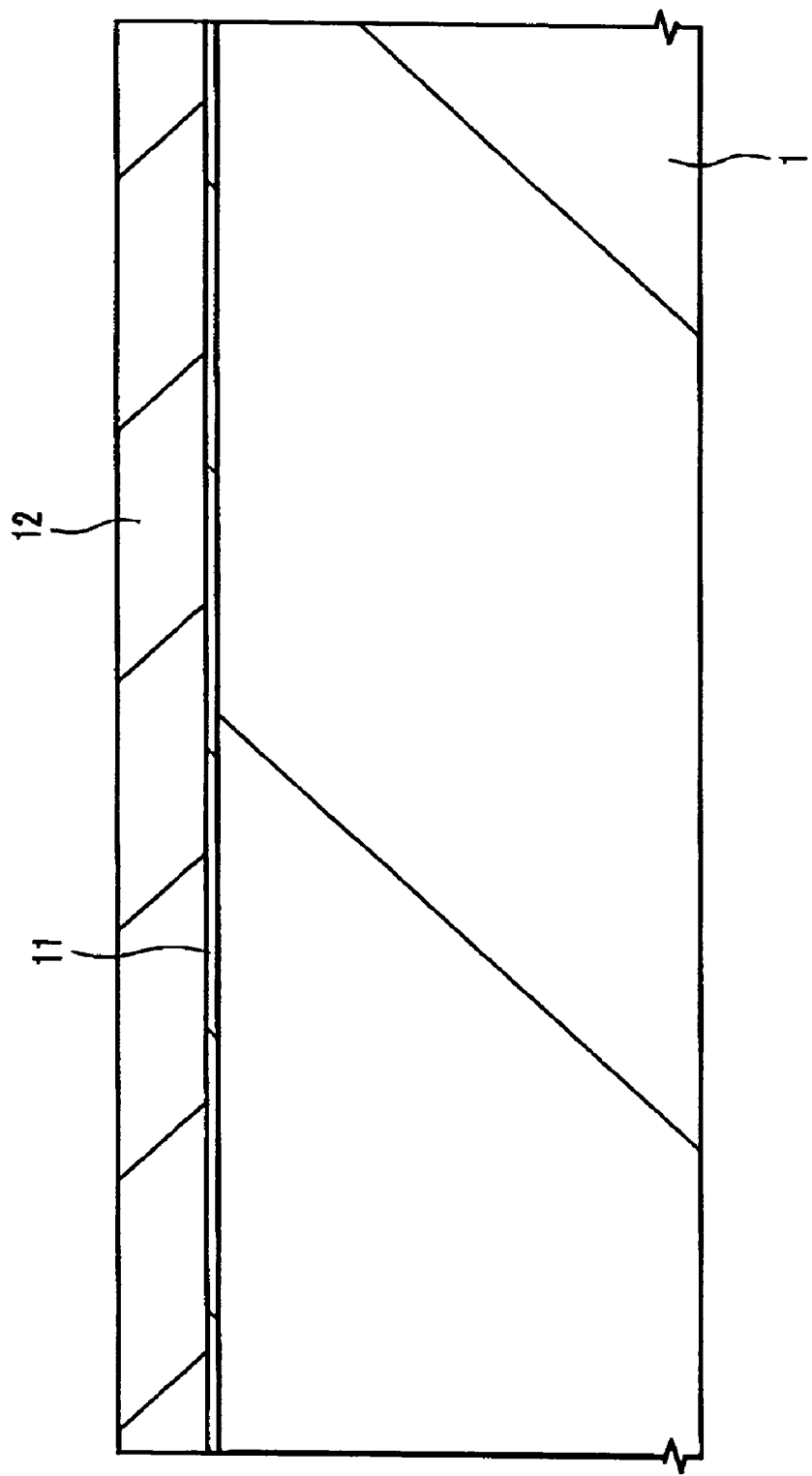
FIG. 1 is a sectional view of substantial parts of a semiconductor substrate for describing a semiconductor device manufacturing method according to an embodiment of the present invention.

An embodiment of the present invention is described in detail below based on the drawings. Note that, throughout all drawings for describing the embodiment, members having the same functions are provided with the same reference numerals, and are not repetitively described herein.

A method of forming an isolation trench according to the embodiment of the present invention is described below with reference to FIGS. 1 through 13 in the process order.

First, as illustrated in FIG. 1, a silicon substrate (hereinafter simply referred to as a substrate) 1 comprised of p-type single crystal silicon having a specific resistance of the order of 1 to 10 $\Omega$cm, for example, is subjected to thermal oxidation to have formed on its surface a pad oxide film 11 comprised of a thin silicon oxide film having a film thickness of the order of 10 nm. On the upper surface of this pad oxide film 11, a silicon nitride film 12 having a film thickness of the order of 120 nm is deposited by the CVD method. Having a property of being resistant to oxidizing, the silicon nitride film 12 is used as a mask for preventing the surface of the substrate 1 thereunder from being oxidized. Also, the pad oxide film 11 under the silicon nitride film 12 is formed in order to ease stress occurring at an interface between the substrate 1 and the silicon nitride film 12 and to prevent defects, such as dislocations, from being caused on the surface of the substrate 1 by the stress.

Figure 2:
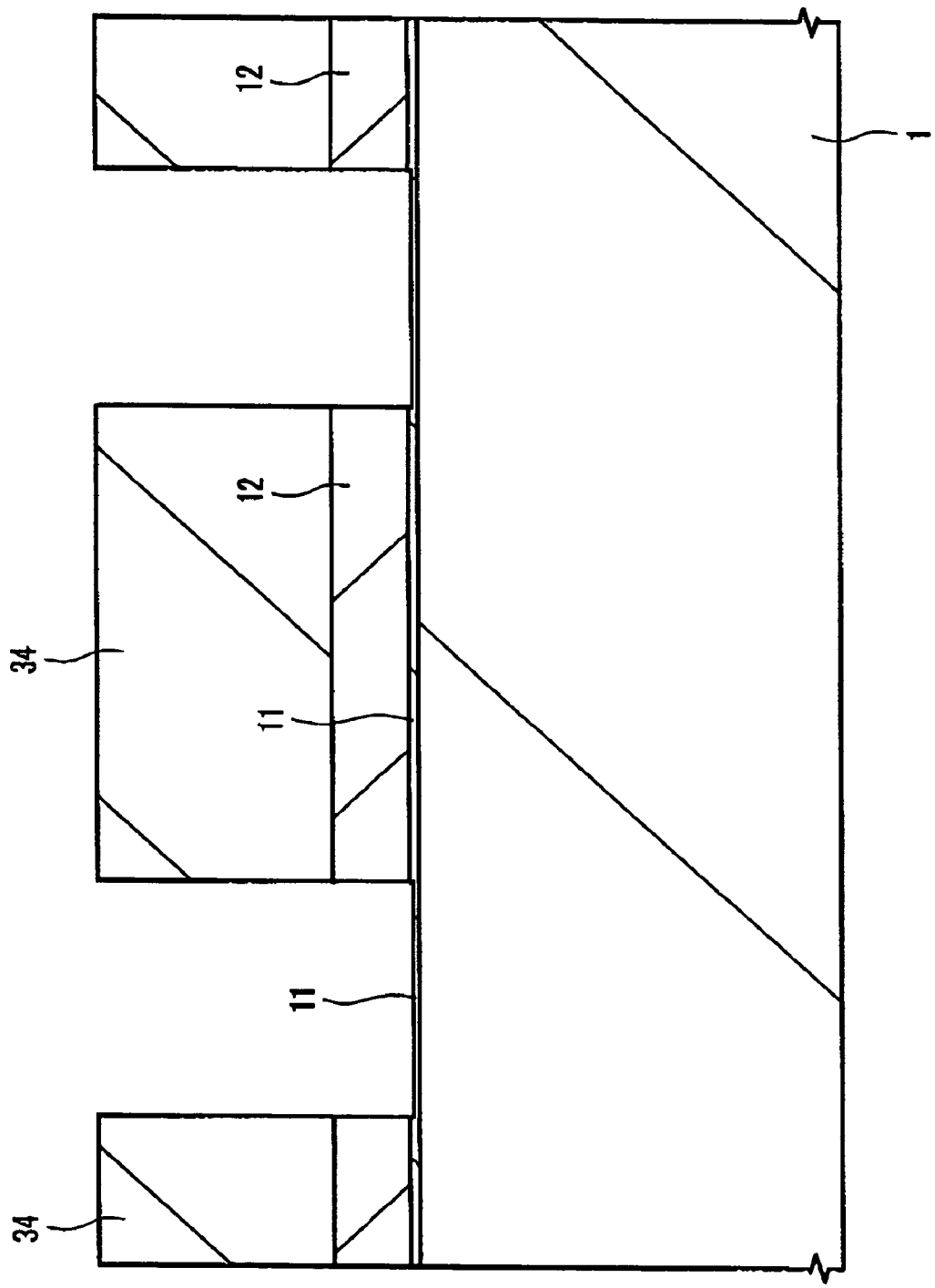
FIG. 2 is a sectional view of substantial parts of a semiconductor substrate for describing a semiconductor device manufacturing method according to an embodiment of the present invention.

Next, as illustrated in FIG. 2, portions of the silicon nitride film 12 in isolation areas are selectively removed by dry etching using the photoresist film 34 as a mask.

Figure 3:
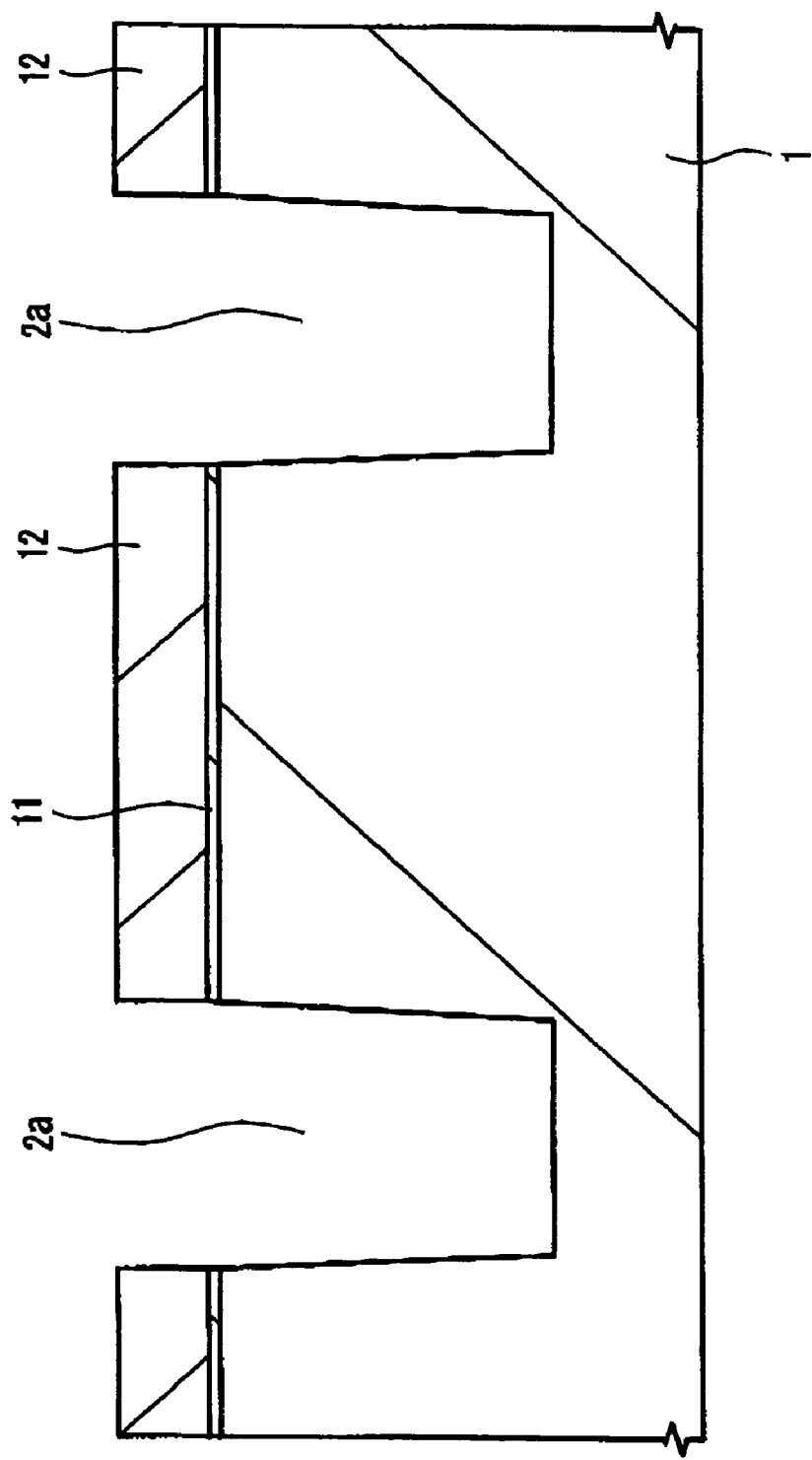
FIG. 3 is a sectional view of substantial parts of a semiconductor substrate for describing a semiconductor device manufacturing method according to an embodiment of the present invention.

Next, after removing the photoresist film 34, as illustrated in FIG. 3, trenches 2a each having a depth of the order of 200 to 400 nm are formed on the isolation areas of the substrate 1 by dry etching using the silicon nitride film 12 as a mask. Note that, in place of the above dry etching using the silicon nitride film 12 as a mask, the photoresist film 34 may be used as a mask to perform dry etching successively on the silicon nitride film 12, the pad oxide film 11, and the substrate 1, thereby forming the trench 2a.

Figure 4:
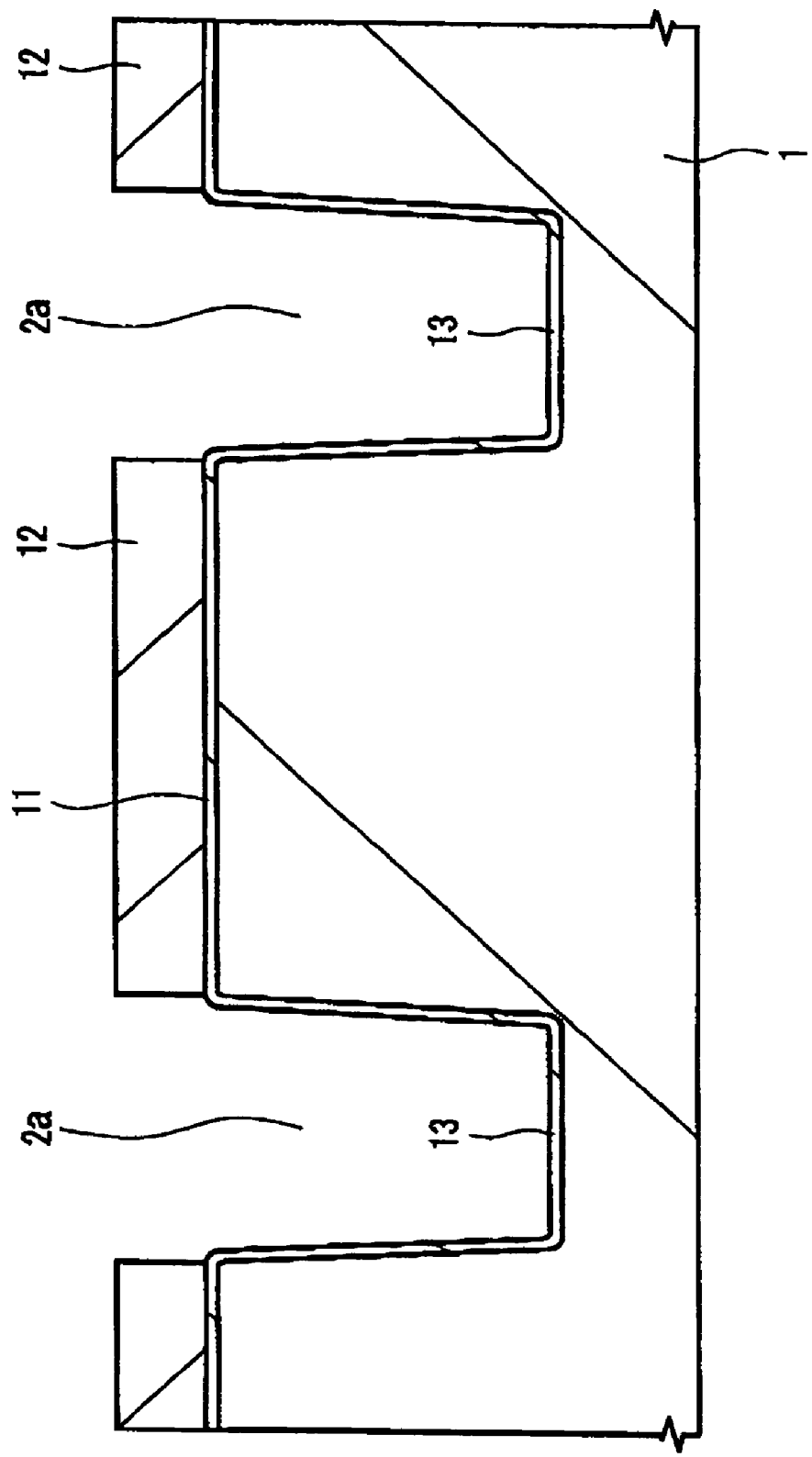
FIG. 4 is a sectional view of substantial parts of a semiconductor substrate for describing a semiconductor device manufacturing method according to an embodiment of the present invention.

Next, in order to remove etching damages remaining on the inner wall of each trench 2a, the inner wall of each trench 2a is oxidized to form a thin silicon oxide film (not shown). Then, the inner wall of each trench 2a is subjected to wet etching for removing this silicon oxide film. Then, as illustrated in FIG. 4, the inner wall of each trench 2a is oxidized again, thereby forming a silicon oxide film 13 having a film thickness of the order of 10 nm.

Figure 5:
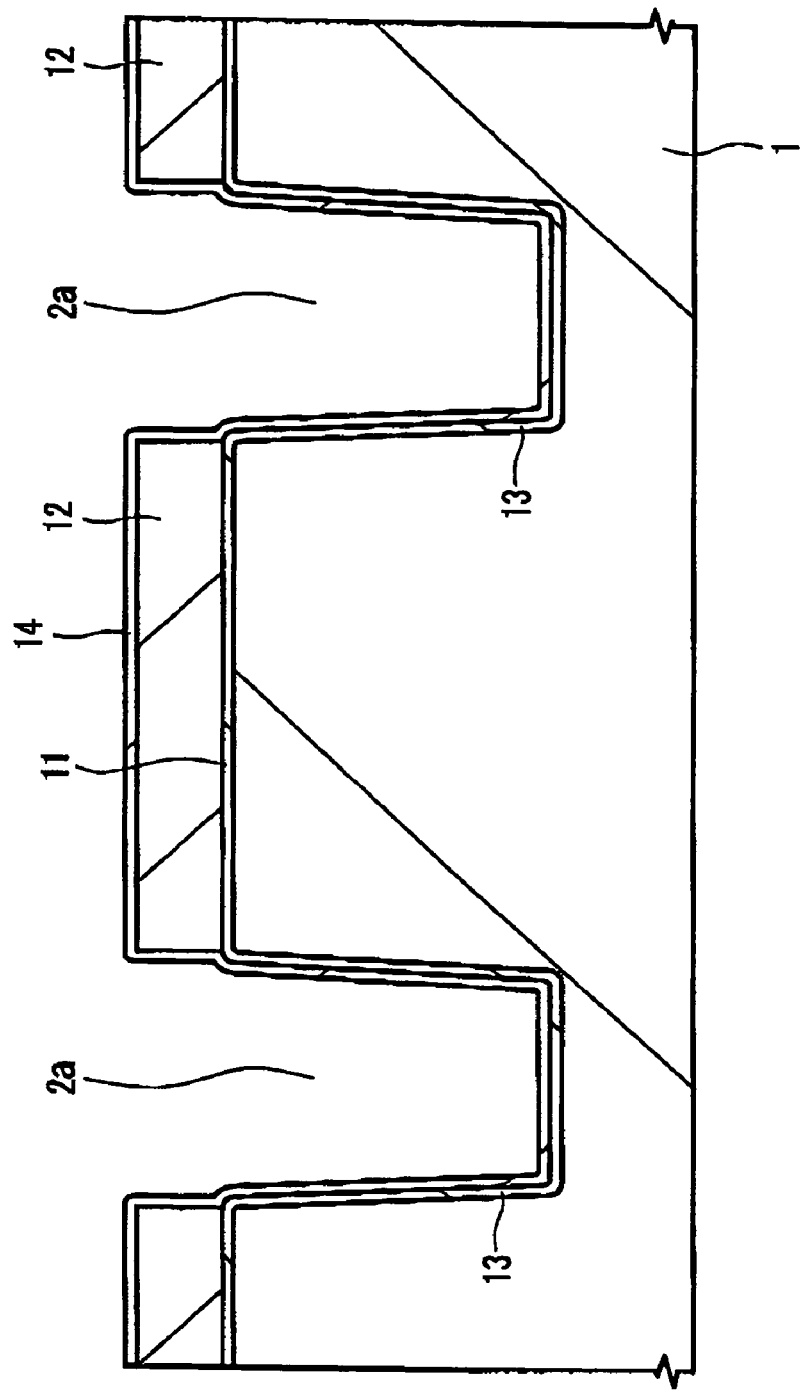
FIG. 5 is a sectional view of substantial parts of a semiconductor substrate for describing a semiconductor device manufacturing method according to an embodiment of the present invention.

Next, as illustrated in FIG. 5, the CVD method is employed to deposit a silicon nitride film liner 14 having a film thickness of the order of 5 to 10 mm over the substrate 1 including the inner wall of each trench 2a. The silicon nitride film liner 14 is formed in order to prevent oxidation of the inner wall of each trench 2a and suppress the occurrence of stress in the subsequent processes.

Figure 6:
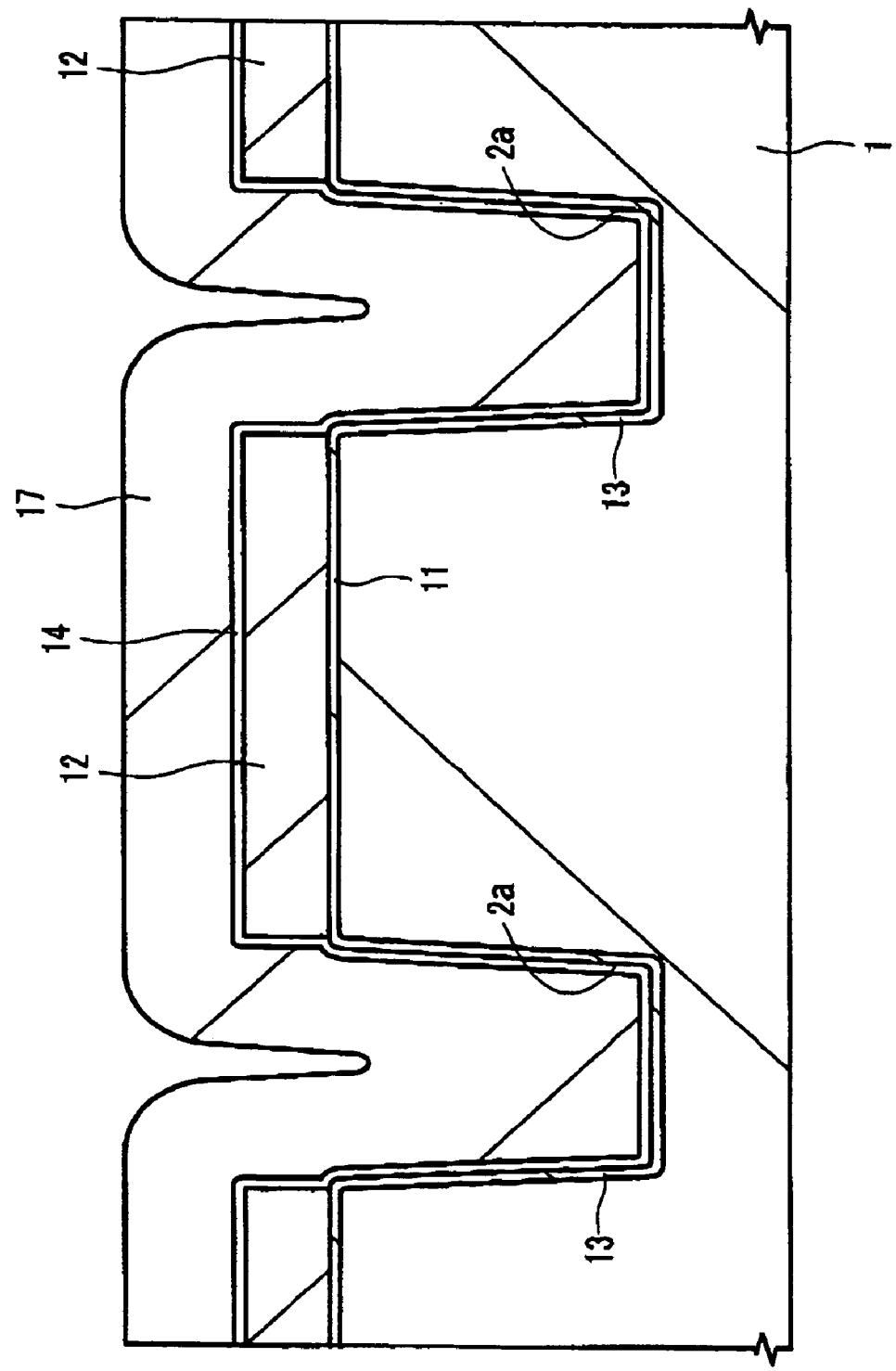
FIG. 6 is a sectional view of substantial parts of a semiconductor substrate for describing a semiconductor device manufacturing method according to an embodiment of the present invention.

Next, as illustrated in FIG. 6, a first embedded insulator film 17 is formed over the substrate 1 including the inner wall of each trench 2a. The embedded insulator film 17 is deposited by a pyrolytic CVD method using monosilane or Tetra Ethoxy Silane (TEOS) as a source gas, for example, so as to have a film thickness of the order of 150 to 390 nm. At this time, the inside of each trench 2a does not have to be completely filled. Note that, when the width of each trench 2a is not more than 0.20 μm or its aspect ratio is not less than 3, a suitable film formation methods is a method capable of achieving excellent gap filling, such as a pyrolytic CVD method using Ozone TEOS ($O_3$-TEOS) as a source gas or the High Density Plasma (HDP)-CVD method.

Figure 7:
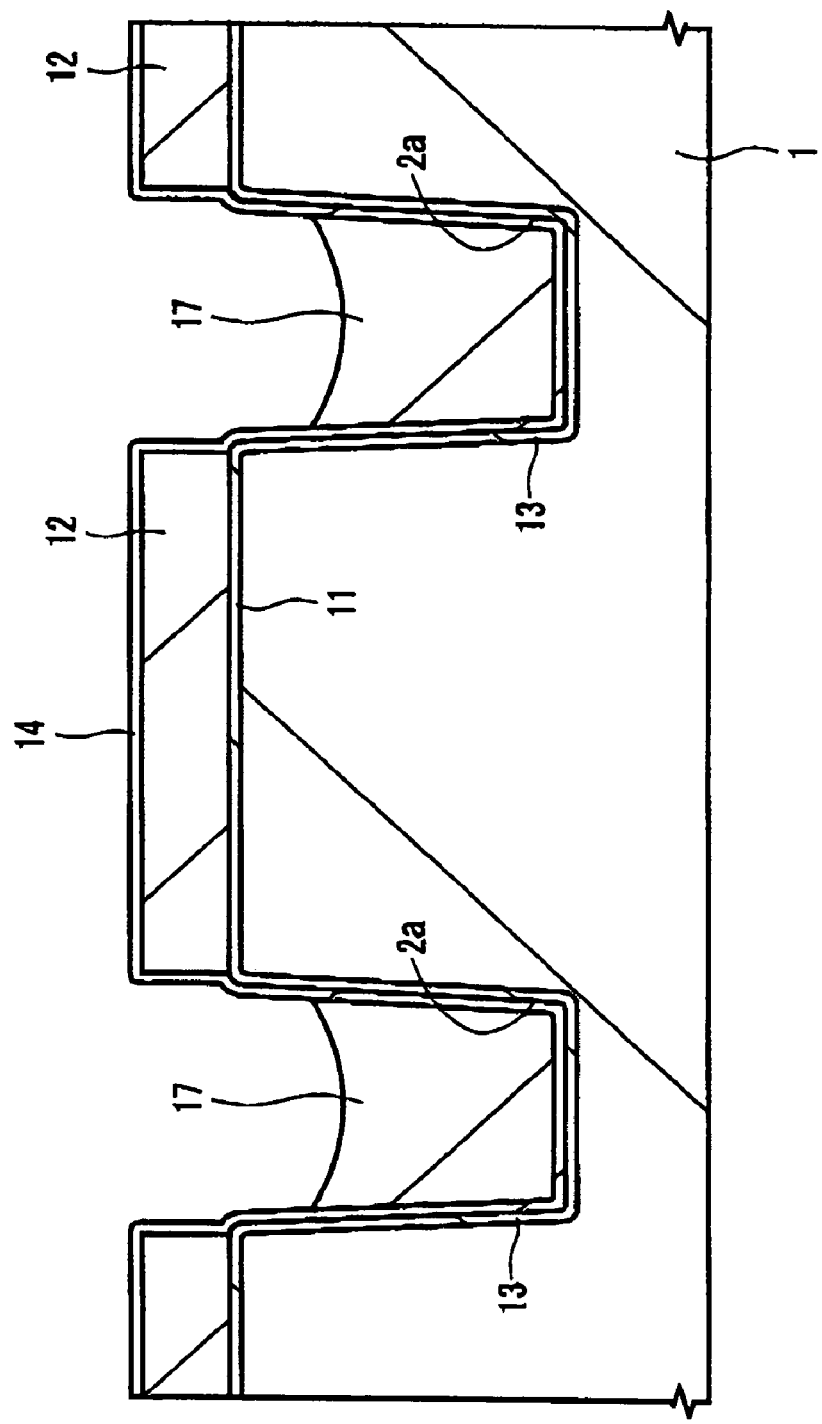
FIG. 7 is a sectional view of substantial parts of a semiconductor substrate for describing a semiconductor device manufacturing method according to an embodiment of the present invention.

Next, as illustrated in FIG. 7, a portion of the embedded insulator film 17 outside each trench 2a is subjected to etching, thereby recessing the upper surface of the embedded insulator film 17, filling inside each trench 2a, up to lower than the surface of the silicon substrate 1 by the order of 10 to 40 nm. The embedded insulator film 17 is etched preferably by wet etching with hydrofluoric acid having an excellent selectivity. However, since the upper end portion of the side wall of each trench 2a affecting the device characteristic is protected by the silicon nitride film liner 14, even in the case where the embedded insulator film 17 is recessed by dry etching, there is no possibility of damaging the upper end portion of the side wall of each trench 2a.

The upper surface of the embedded insulator film 17 is preferably recessed lower than the depth of a channel of a MOS transistor which will be formed later, In particular, when a MOS transistor having an embedded channel, such as a p-channel MOS transistor, is formed, the upper surface of the embedded insulator film 17 is preferably recessed lower than the depth of the embedded channel. However, in the case where the amount of recess of the embedded insulator film 17 is too large, the area of the silicon nitride film liner 14 to be converted to a non-silicon-nitride type insulator film is increased, thereby reducing the effect of the silicon nitride film liner 14 (the effect of easing stress). Therefore, the upper surface of the embedded insulator film 17 is preferably positioned to be as close to the upper end portion of the trench 2a as possible as long as the depth of the embedded insulator film 17 is not shallower than that of the channel.

Figure 8:
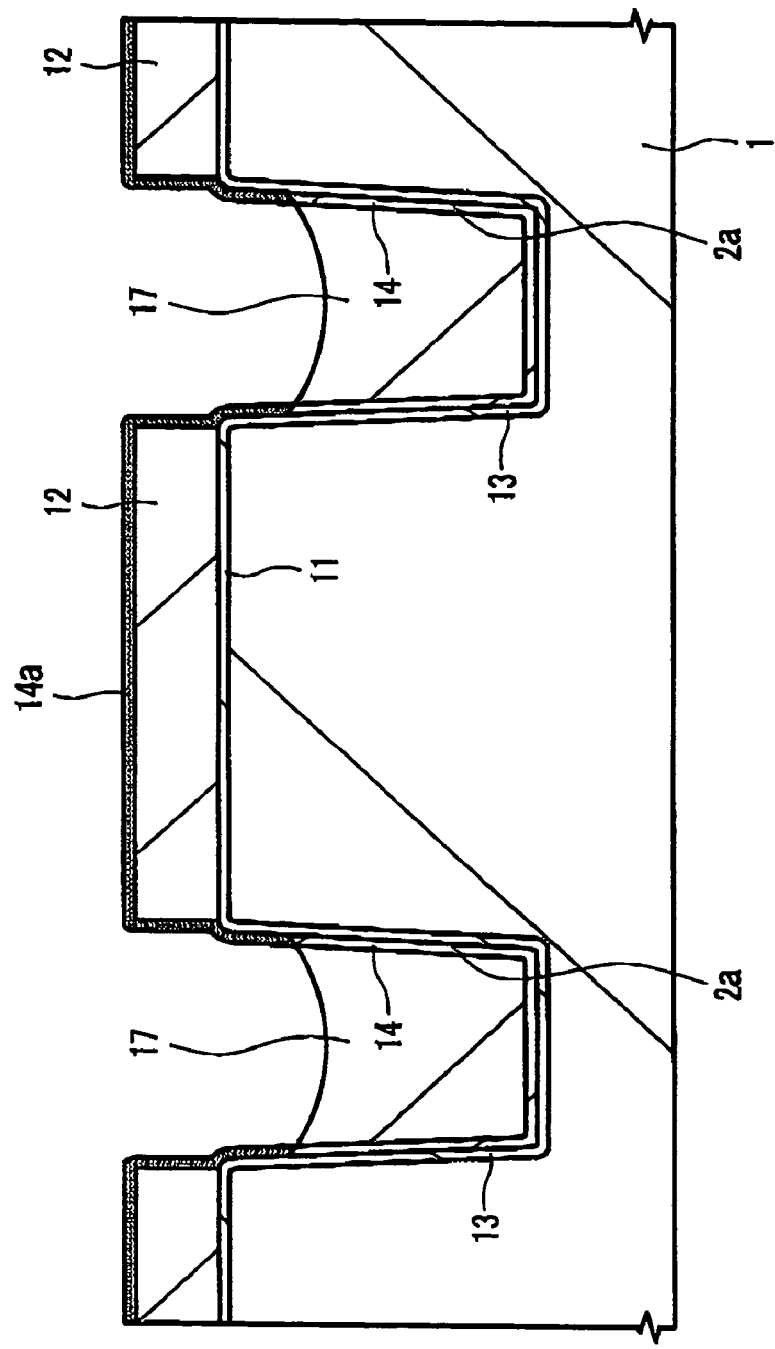
FIG. 8 is a sectional view of substantial parts of a semiconductor substrate for describing a semiconductor device manufacturing method according to an embodiment of the present invention.

Next, as illustrated in FIG. 8, of the silicon nitride film liner 14 covering the surface of the silicon nitride film 12 and the inner wall of the trenches 2a, only a portion that is exposed from the embedded insulator film 17 is converted into a non-silicon-nitride type insulator film, for example, a silicon oxide film 14a.

Examples of a method of converting silicon nitride into silicon oxide are a plasma oxidization method and the In situ Steam Generation (ISSG) oxidation method disclosed in U.S. Pat. No. 6,410,456.

In particular, the ISSG oxidation method uses highly oxidative oxygen radical and therefore has a high capability of converting silicon nitride to silicon oxide. For this reason, when the thickness of the silicon nitride film liner 14 is 5 nm or larger, this ISSG oxidation method is suitable. The ISSG oxidation method is also preferable because it is capable of performing conversion to the silicon oxide film 14a of high quality without damaging the silicon nitride film liner 14. The process conditions for ISSG oxidation are, for example, that process temperatures are 700 to 1100 degrees Celsius and that processing time is in the range of 5 to 300 seconds.

Figure 9:
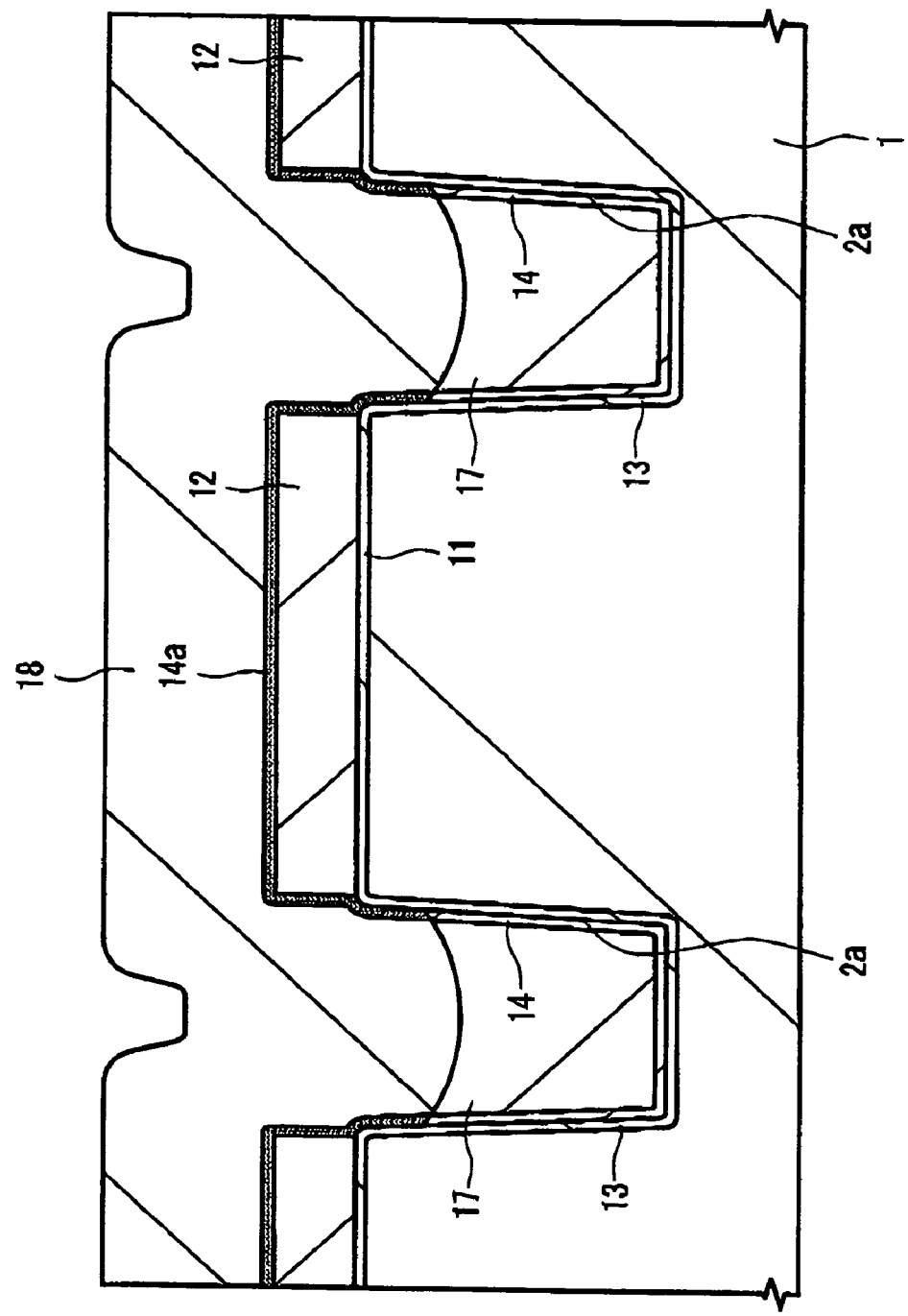
FIG. 9 is a sectional view of substantial parts of a semiconductor substrate for describing a semiconductor device manufacturing method according to an embodiment of the present invention.

Next, as illustrated in FIG. 9, a second embedded insulator film 18 comprised of a silicon oxide film is formed over the substrate 1 including the inside of each trench 2a. The film thickness of the embedded insulator film 18 is taken as of the order of 150 to 400 nm. Also, examples of a film formation method to be used are, as with the case for the above first embedded insulator film 17, a pyrolytic CVD method using monosilane or TEOS as a source gas, the pyrolytic CVD method using $O_3$-TEOS as a source gas, and the HDP-CVD method.

Figure 10:
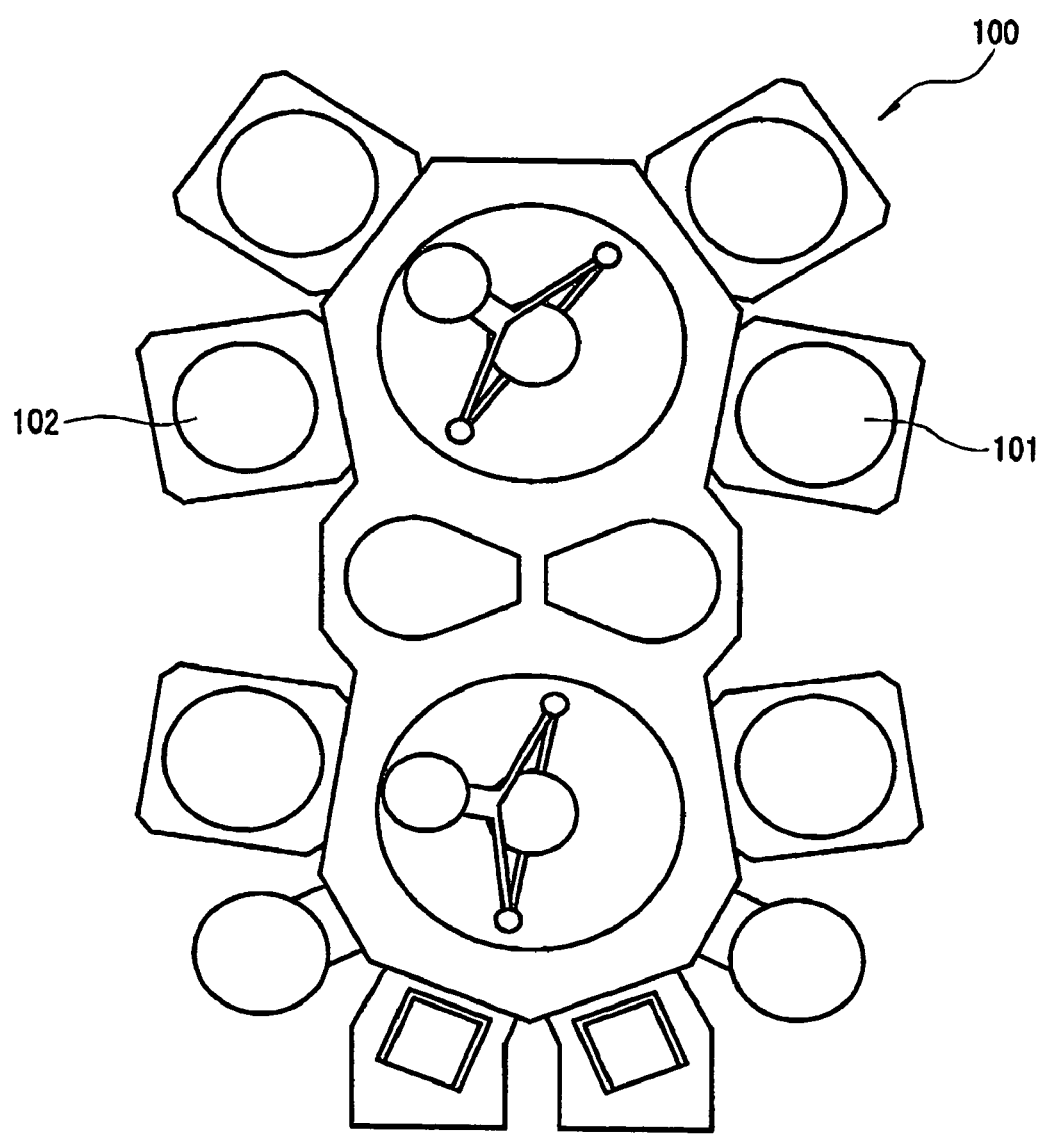
FIG. 10 is a schematic plan view of a multi-chamber device for use in manufacturing a semiconductor device according to the embodiment of the present invention.

The above-described plasma oxidation (or ISSG oxidation) process of converting the silicon nitride film liner 14 into the silicon oxide film 14a and then the CVD process of depositing the second embedded insulator film 18 can be successively performed by a single apparatus including a plurality of chambers. FIG. 10 illustrates a schematic plan view of a multi-chamber 100 to be used for this purpose. For example, plasma oxidation (or ISSG oxidation) is performed by a first chamber 101, and subsequently the second embedded insulator film 18 is deposited by a second chamber 102.

With this, it is possible to improve throughputs of the above processes, and also to prevent the reliability of the MOS transistor from being degraded due to film contamination. In particular, in the case of the p-channel MOS transistor which receives the influence of electrons susceptible to being trapped in the silicon nitride film liner 14, a shift in threshold voltage can be effectively prevented.

Figure 11:
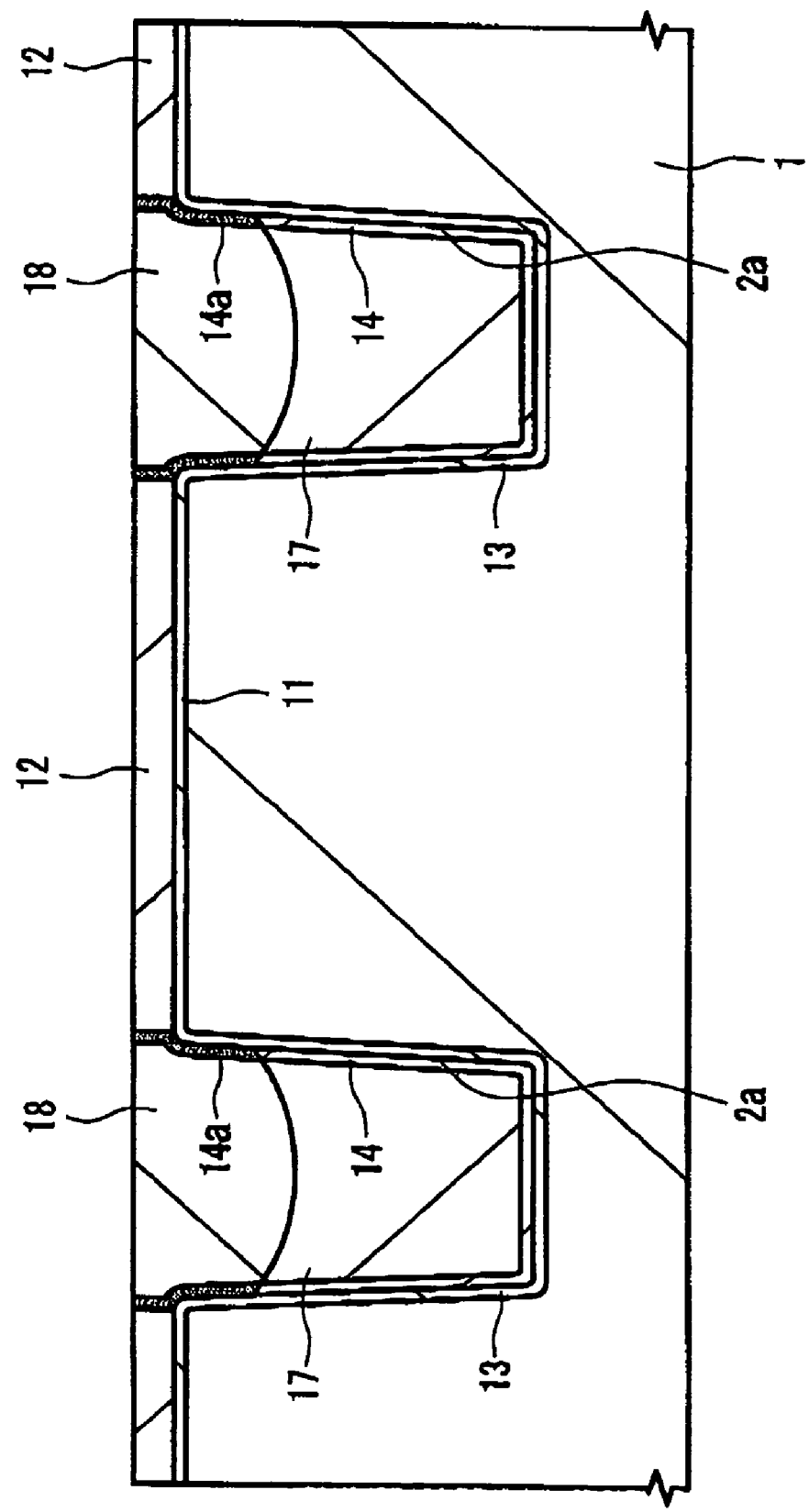
FIG. 11 is a sectional view of substantial parts of a semiconductor substrate for describing a semiconductor device manufacturing method according to an embodiment of the present invention.
Figure 12:
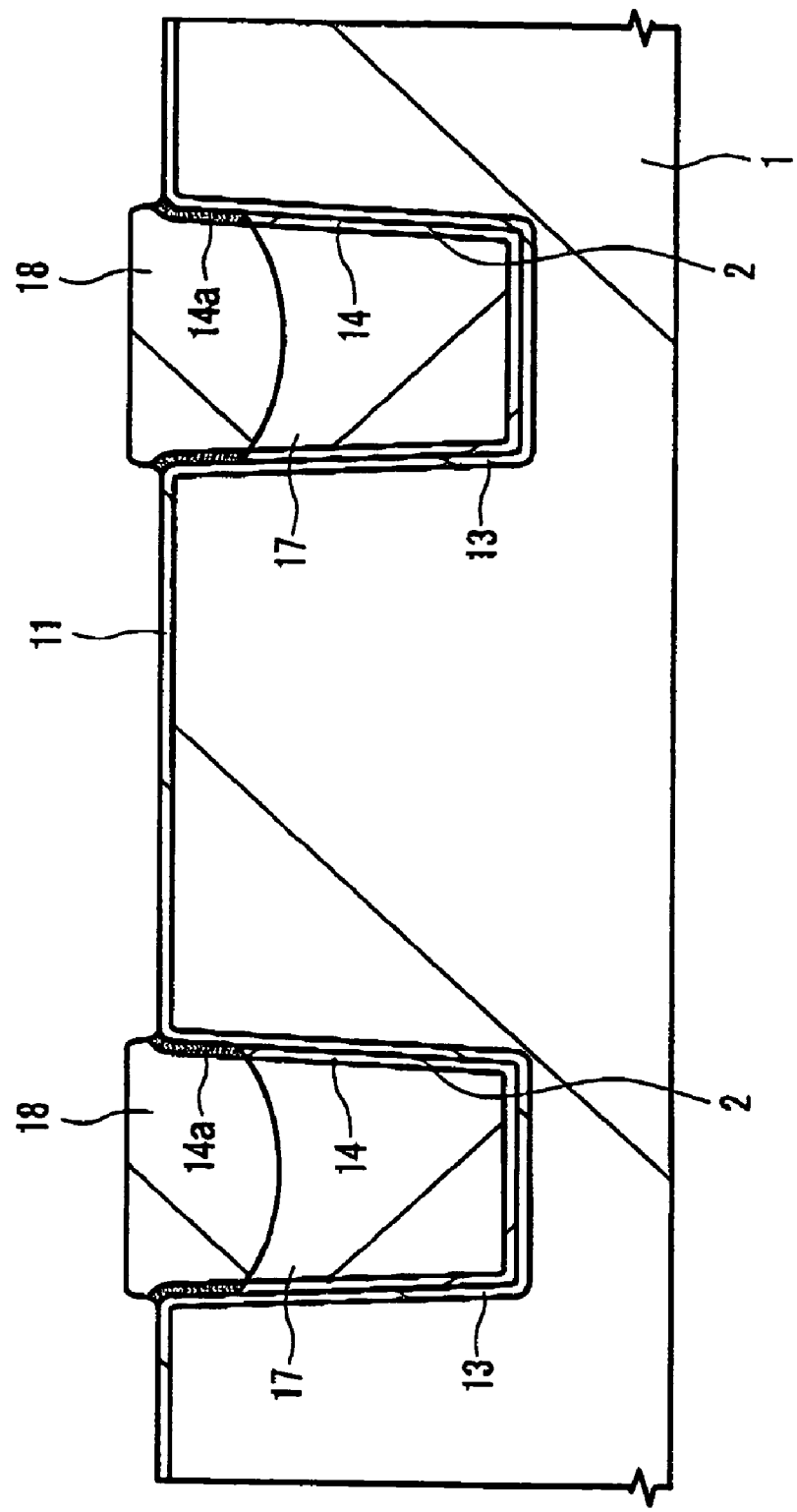
FIG. 12 is a sectional view of substantial parts of a semiconductor substrate for describing a semiconductor device manufacturing method according to an embodiment of the present invention.

Next, as illustrated in FIG. 11, a portion of the insulator film 18 outside of each trench 2a is flatly removed by the CMP method until the silicon nitride film 12 thereunder is exposed. Then, as illustrated in FIG. 12, the silicon nitride film 12 is removed by wet etching with hot phosphoric acid. At this time, the upper end portion of the silicon nitride film liner 14 on the inner wall of each isolation trench 2 has been converted to the silicon oxide film 14a which is resistant to being removed with hot phosphoric acid. Therefore, when the silicon nitride film 12 is removed with hot phosphoric acid, a recess problem that the upper end portion of the silicon nitride film liner 14 is removed to be recessed downward does not occur. With the processes so far, the isolation trench 2 is completed which is filled with the embedded insulator films 17 and 18 of two layers and having formed on its inner wall the silicon nitride film liner 14 and the silicon oxide film 14a.

Figure 13:
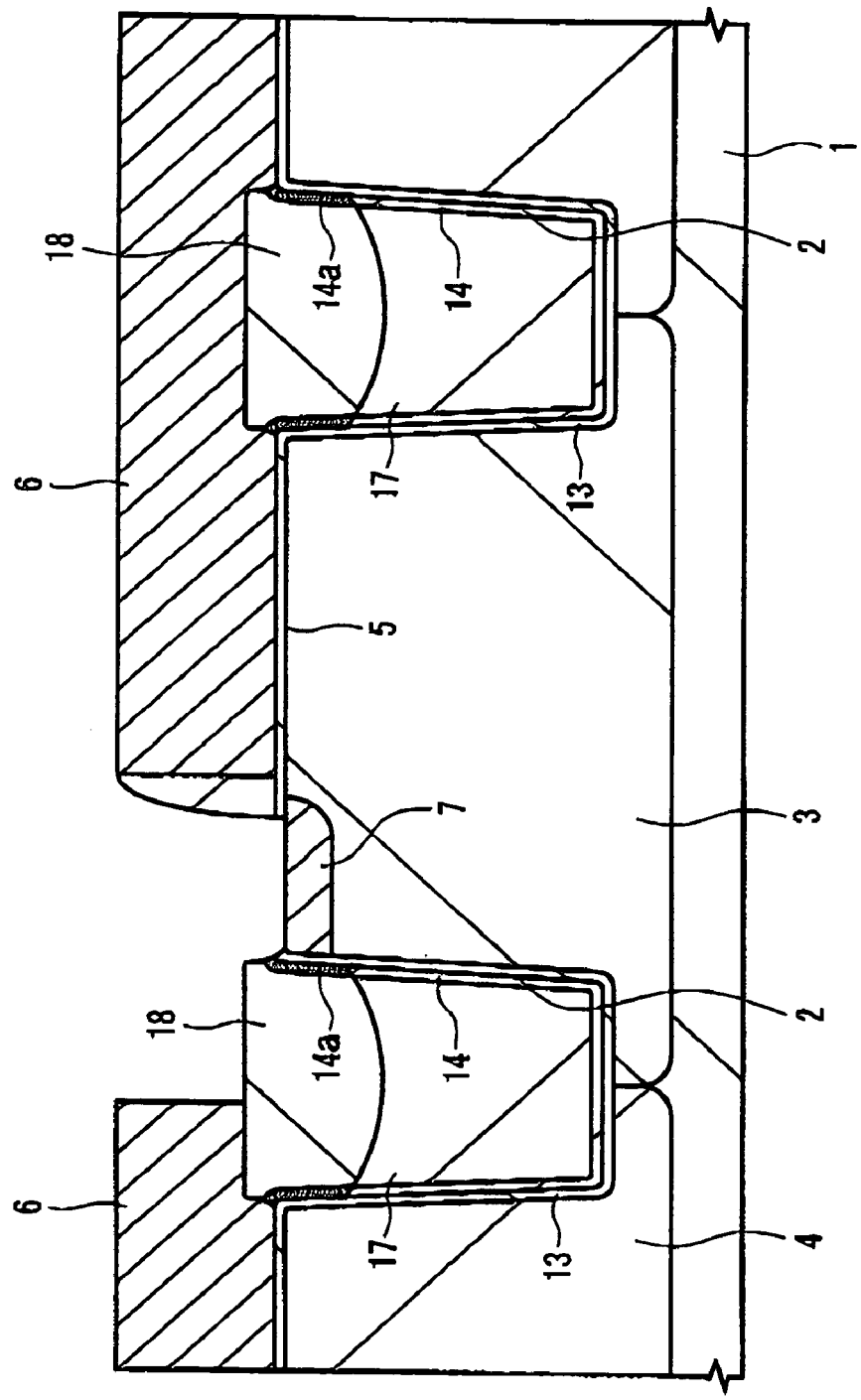
FIG. 13 is a sectional view of substantial parts of a semiconductor substrate for describing a semiconductor device manufacturing method according to an embodiment of the present invention.
Figure 14:
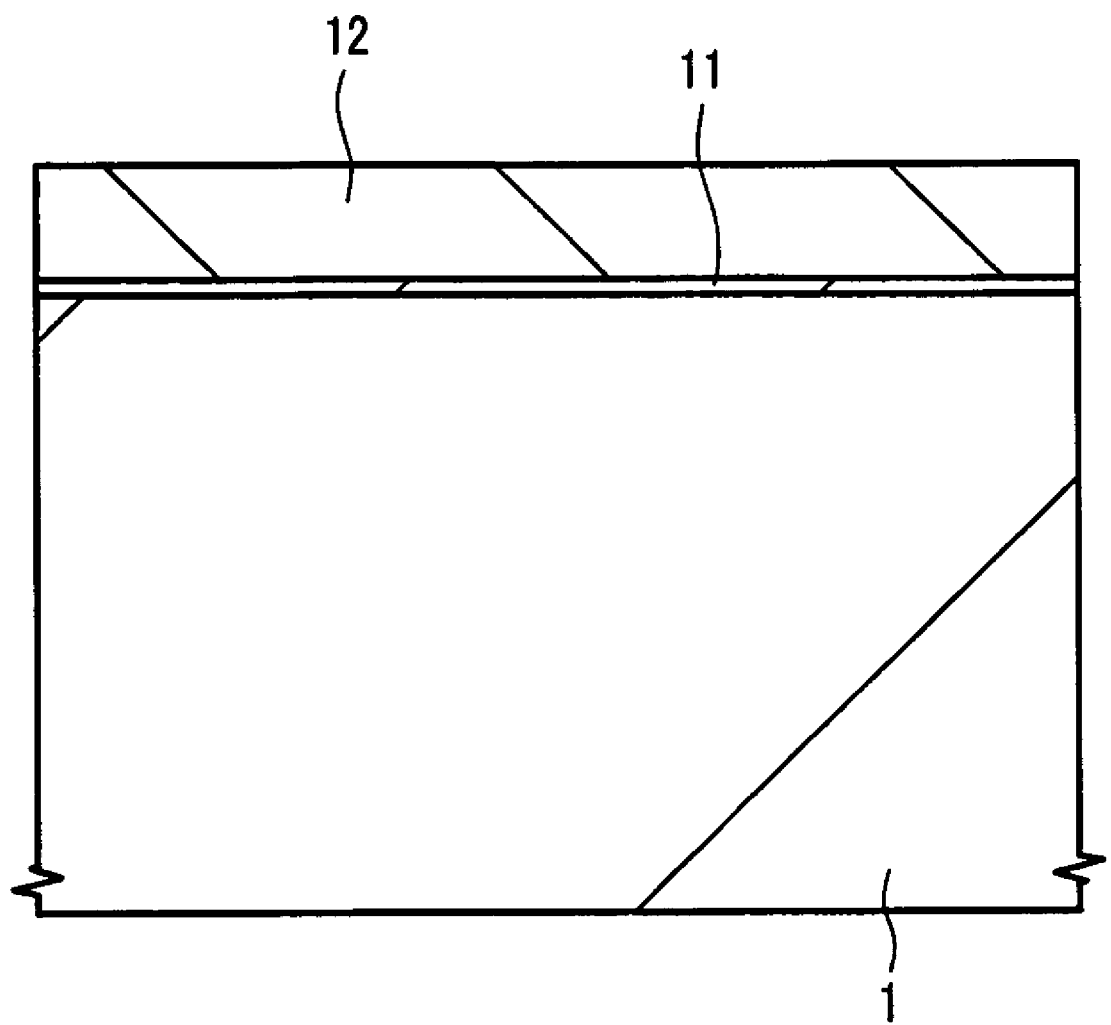
FIG. 14 is a sectional view of substantial parts of a semiconductor substrate for describing a method of forming an isolation trench studied by the inventors.
Figure 15:
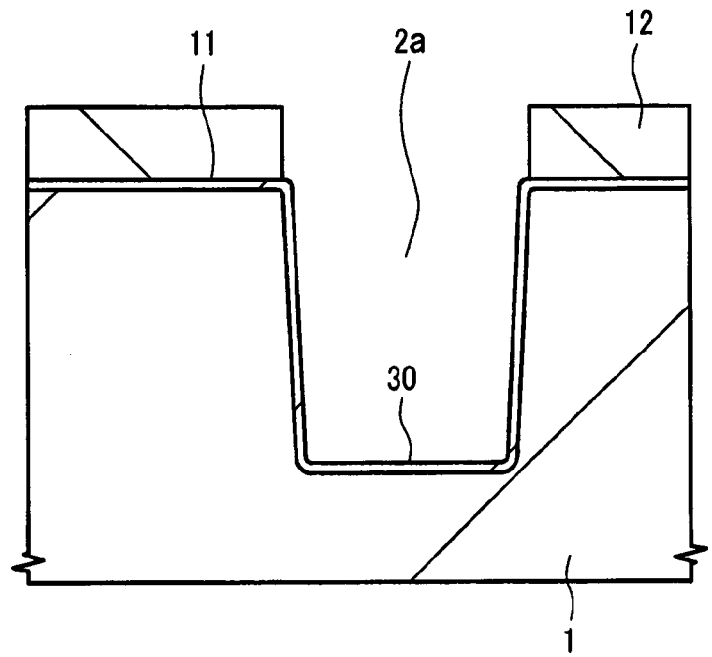
FIG. 15 is a sectional view of substantial parts of a semiconductor substrate for describing a method of forming an isolation trench studied by the inventors.
Figure 16:
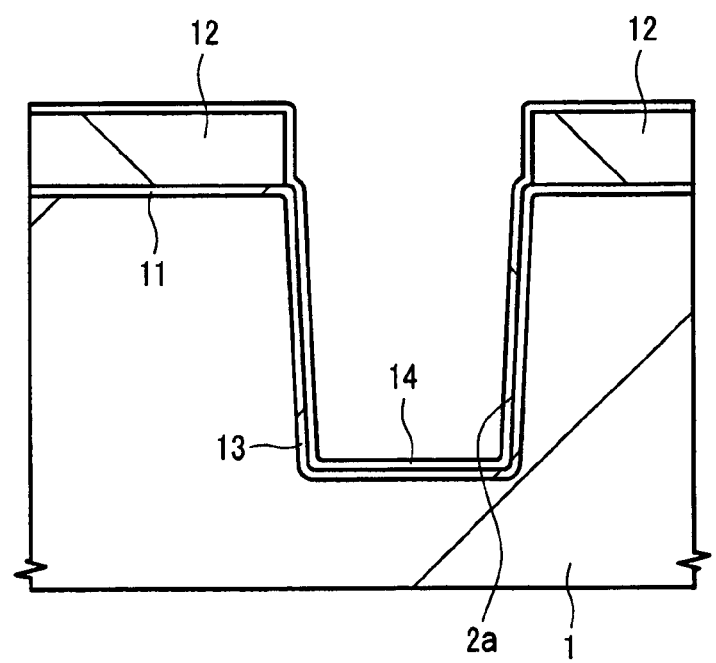
FIG. 16 is a sectional view of substantial parts of a semiconductor substrate for describing a method of forming an isolation trench studied by the inventors.
Figure 17:
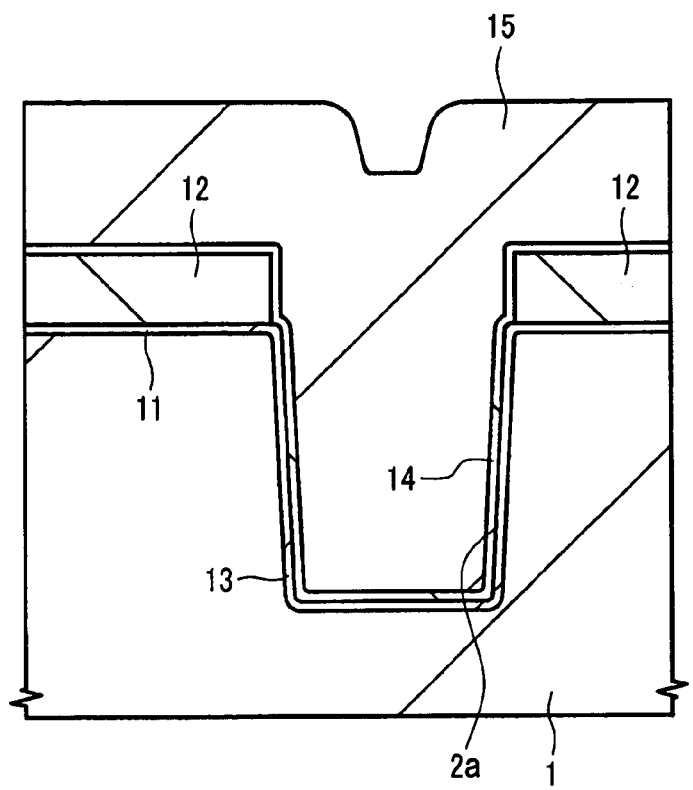
FIG. 17 is a sectional view of substantial parts of a semiconductor substrate for describing a method of forming an isolation trench studied by the inventors.
Figure 18:
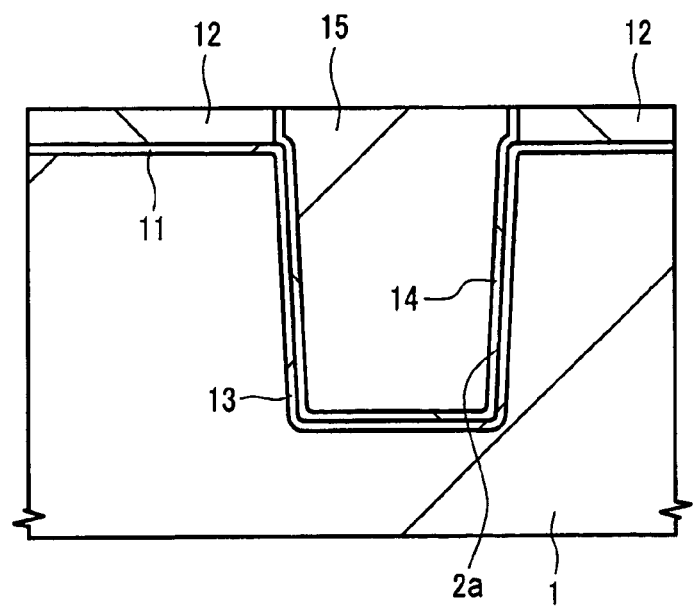
FIG. 18 is a sectional view of substantial parts of a semiconductor substrate for describing a method of forming an isolation trench studied by the inventors.
Figure 19:
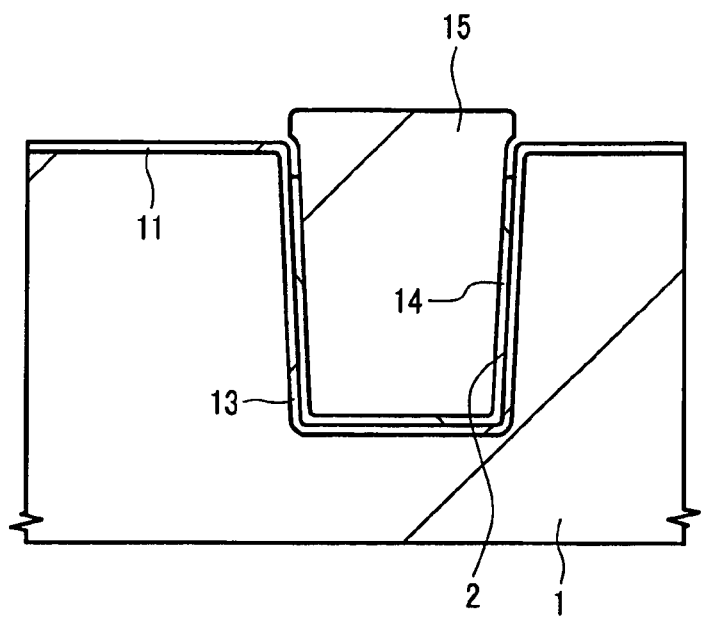
FIG. 19 is a sectional view of substantial parts of a semiconductor substrate for describing a method of forming an isolation trench studied by the inventors.
Figure 20:
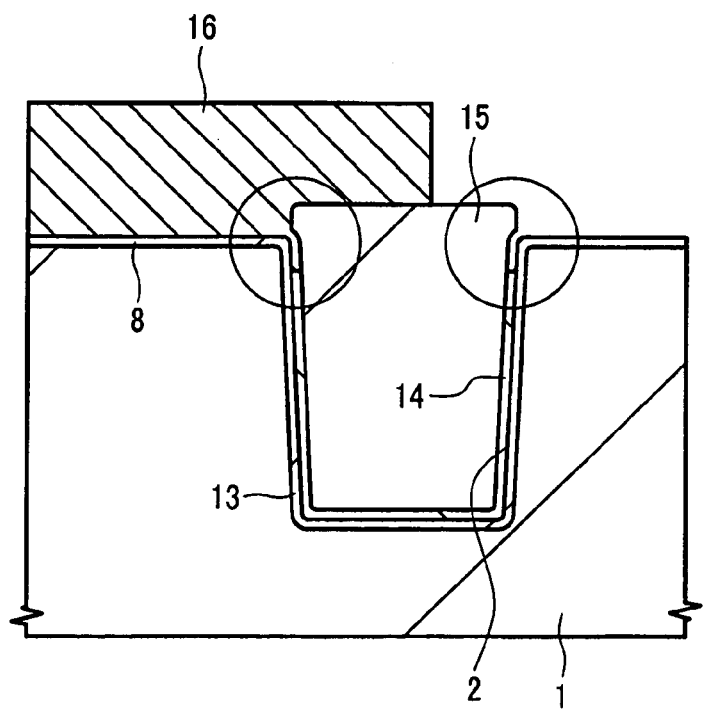
FIG. 20 is a sectional view of substantial parts of a semiconductor substrate for describing a method of forming an isolation trench studied by the inventors.
Figure 21:
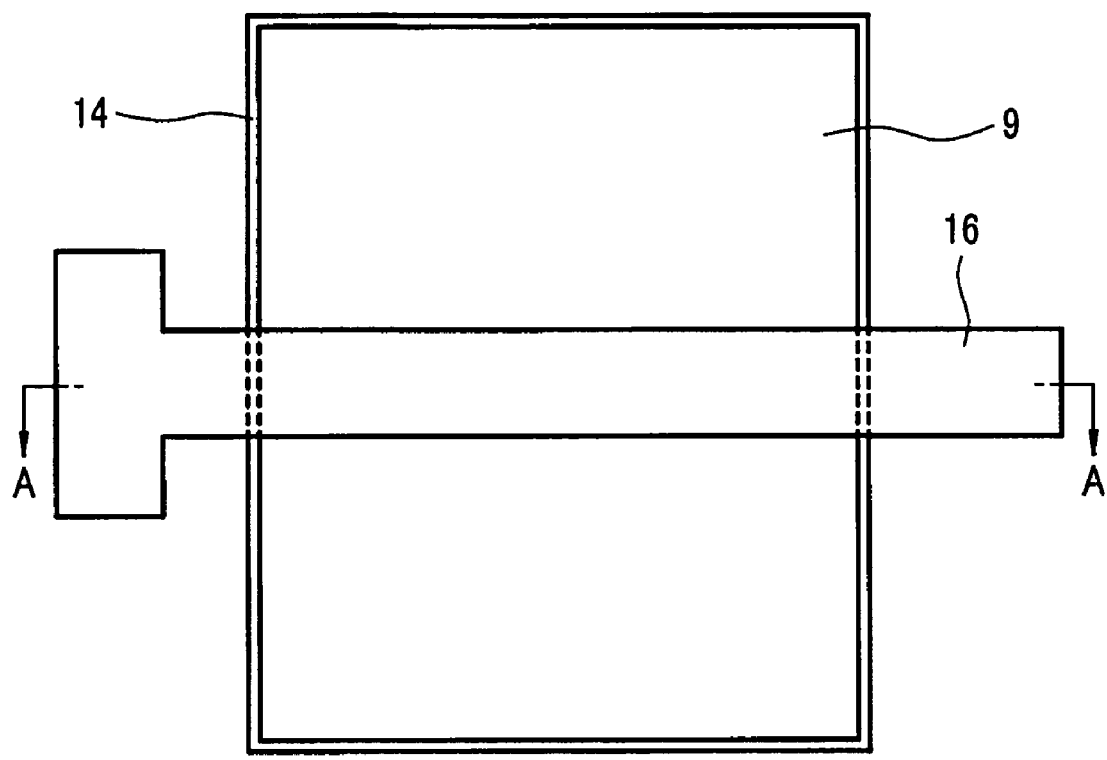
FIG. 21 is a plane view of a silicon substrate having a MOS transistor formed thereon.
Figure 23:
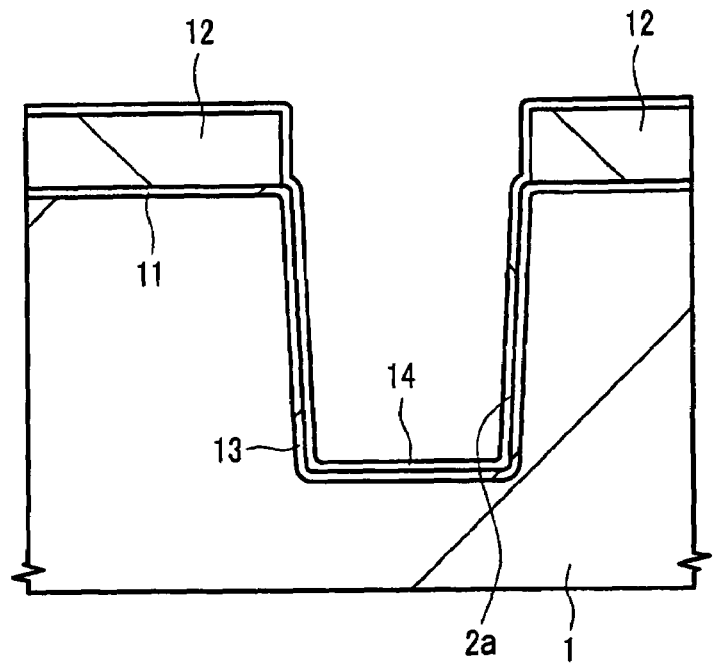
FIG. 23 is a sectional view of substantial parts of a semiconductor substrate for describing a method of forming an isolation trench studied by the inventors.
Figure 24:
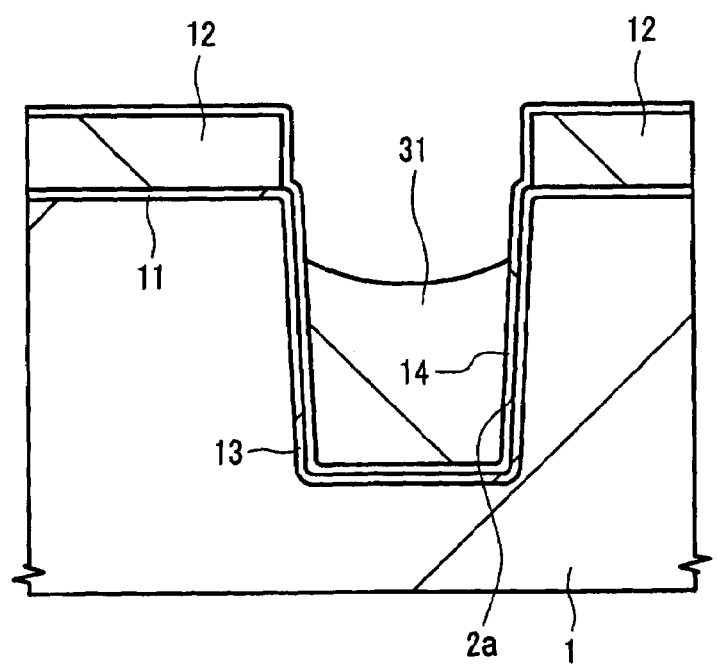
FIG. 24 is a sectional view of substantial parts of a semiconductor substrate for describing a method of forming an isolation trench studied by the inventors.
Figure 25:
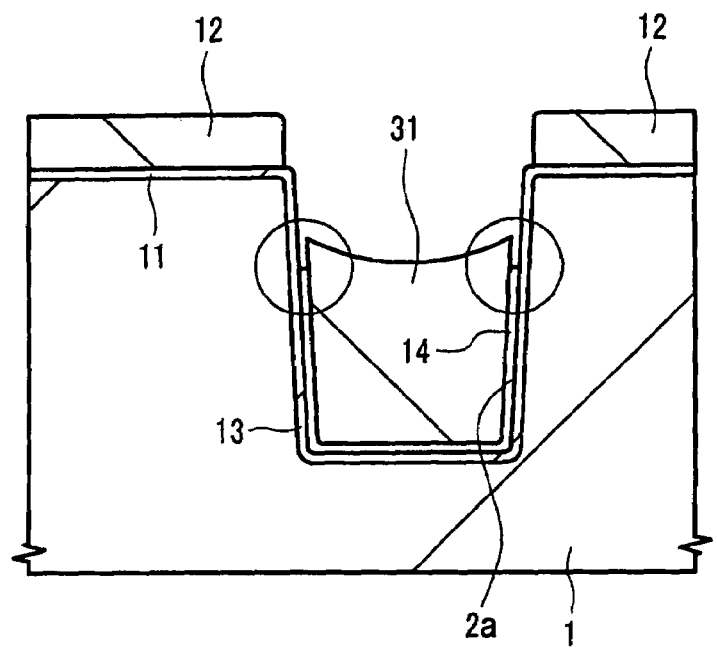
FIG. 25 is a sectional view of substantial parts of a semiconductor substrate for describing a method of forming an isolation trench studied by the inventors.
Figure 26:
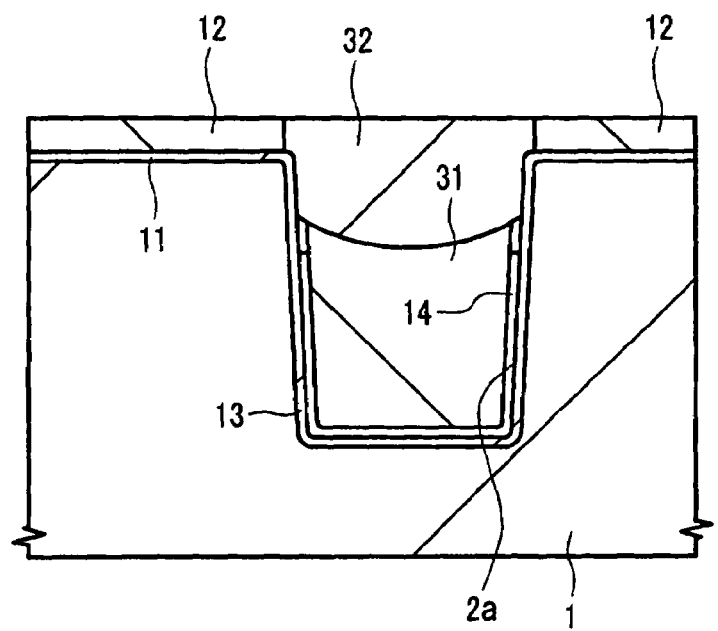
FIG. 26 is a sectional view of substantial parts of a semiconductor substrate for describing a method of forming an isolation trench studied by the inventors.
Figure 27:
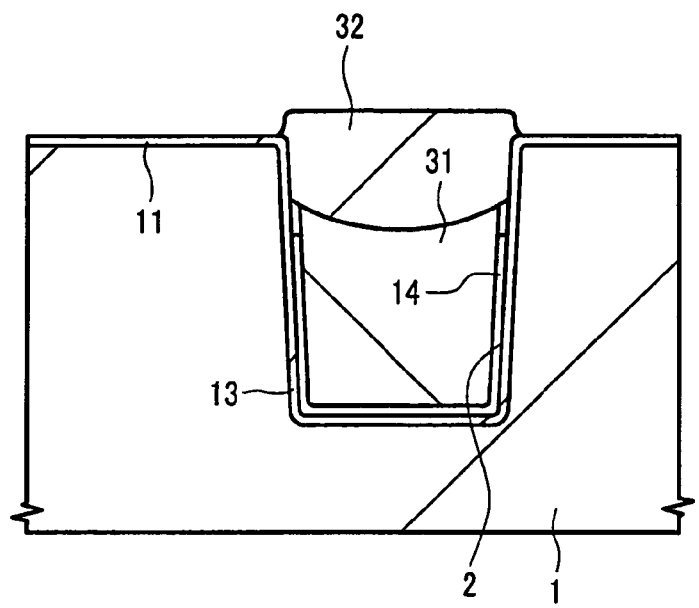
FIG. 27 is a sectional view of substantial parts of a semiconductor substrate for describing a method of forming an isolation trench studied by the inventors.
Figure 28:
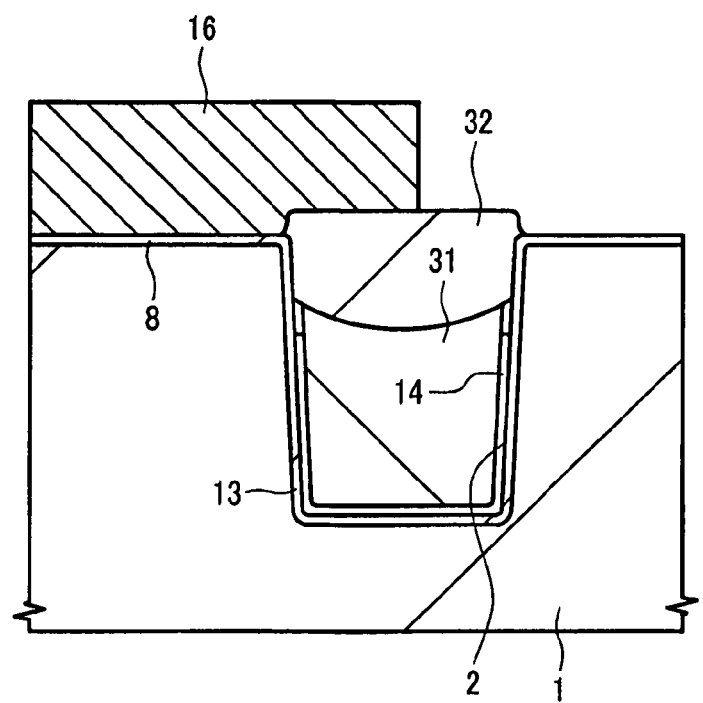
FIG. 28 is a sectional view of substantial parts of a semiconductor substrate for describing a method of forming an isolation trench studied by the inventors.

Then, as illustrated in FIG. 13, impurities are ion-implanted into the substrate 1 to form an n-type well 3, a p-type well 4, and a channel area (not shown). Then, in accordance with the normal MOS process, a gate insulator film 5, a gate electrode 6, and a semiconductor area 7 including a source and a drain are formed, thereby completing a MOS transistor.

In the foregoing, the invention made by the inventors of this invention has been described in detail based on the embodiments. However, it goes without saying that the present invention is not limited to the above-described embodiments, and various changes and modifications of the invention can be made without departing from the spirit and scope of the invention.

In the above embodiment, the embedded insulator films 17 and 18 of two layers for filling the isolation trench 2 are comprised of silicon oxide films. However, when the width of the isolation trench 2 is extremely narrow and its aspect ratio is large, at least one of these embedded insulator films 17 and 18 of two layers is comprised of a Spin on Glass (SOG) film, which is one type of a coating film, thereby achieving excellent embedding. In particular, in the case of a fine isolation trench 2 whose trench width is not larger than 0.10 μm and whose aspect ratio is not smaller than 5, embedding is difficult even with the use of the pyrolytic CVD method using $O_3$-TEOS as a source gas or the HDP-CVD method. Therefore, the SOG film is preferably used.

In general, the SOG film has an excellent embedding property compared with a silicon oxide film deposited by the CVD method, but has a low temperature resistance property. Examples of a high heat-resistant SOG film applicable to an isolation trench formation process including a high heat treatment not lower than 1000 degrees Celsius are a polysilazane-type SOG film and an SOG film including porous silica.

The polysilazane-type SOG film has a property of being converted to a silicon oxide film when being subjected to heat treatment in an atmosphere including $H_2O$ at a temperature of 600 to 1100 degrees. Celsius after being coated. Therefore, a heat resistant property equivalent to that of the CVD-silicon oxide film can be obtained. Thus, the polysilazane-type SOG film is expediently used as the first embedded insulator film 17. In this case, the second embedded insulator film 18 may be comprised of an SOG film or of a CVD-silicon oxide film in consideration of suitability to the conventional process.

An SOG film including porous silica is also suitable for the first embedded insulator film 17. In the conventional isolation trench formation process, it is difficult to apply a porous film because the conventional process includes a wet process. In the present invention, however, the upper end portion of the silicon nitride film liner 14 is converted to the silicon oxide film 14a with the use of a dry process, such as a plasma oxidization process or an ISSG oxidization process. Therefore, a porous film can be used. In this case, with the second embedded insulator film 18 being comprised of a CVD-silicon oxide film, it is possible to reduce the capacitance of the isolation trench and to ease stress.

Typical effects obtained through the present invention are briefly described as follows.

According to the isolation method, the position of the upper end portion of the silicon nitride film liner formed on the inner wall of the trench can be accurately controlled. Therefore, it is possible to prevent a shift in threshold voltage due to hot carriers and also to suppress stress due to oxidation of the inner wall of the trench.

Also, the embedded insulator film is divided into two layers for filling the trench, and at least one of the embedded insulator films of two layers is comprised of an SOG film. With this, it is possible to fill even a fine isolation trench with the embedded insulator films.

What is claimed is:

1. A semiconductor device manufacturing method, comprising the steps of:
    forming a trench by etching a silicon substrate;
    forming a silicon nitride film along an inner wall of said trench;
    forming a first embedded insulator film inside said trench, said first embedded insulator film having a film thickness so as not to completely fill said trench;
    converting a portion of said silicon nitride film which is exposed from said first embedded insulator film into a non-silicon-nitride type insulator film, thereby leaving a remaining portion of said silicon nitride film between said first embedded insulator film and said inner wall of said trench; and
    forming a second embedded insulator film on said first embedded insulator film so that said trench is filled with said first and second embedded insulator films.

2. The semiconductor device manufacturing method according to claim 1, further comprising, prior to the step of forming said silicon nitride film along said inner wall of said trench, a step of oxidizing said inner wall of said trench to form a silicon oxide film.

3. The semiconductor device manufacturing method according to claim 1, wherein
    said non-silicon-nitride type insulator film is positioned lower than a channel depth of a MOS transistor to be formed on said silicon substrate.

4. The semiconductor device manufacturing method according to claim 1, wherein
    said exposed portion of said silicon nitride film is converted into said non-silicon-nitride type insulator film by using an ISSG oxidation method.

5. The semiconductor device manufacturing method according to claim 1, wherein
    the step of converting said exposed portion of said silicon nitride film into said non-silicon-nitride type insulator film and the step of forming said second embedded insulator film on said first embedded insulator film are successively performed in a same apparatus.

6. The semiconductor device manufacturing method according to claim 1, wherein
    said first embedded insulator film is formed by either one of a pyrolytic CVD method using $O_3$-TEOS as a source gas and an HDP-CVD method.

7. The semiconductor device manufacturing method according to claim 1, wherein
    at least one of said first and second embedded insulator films is formed by using a coating method.

8. The semiconductor device manufacturing method according to claim 7, wherein
    said insulator film formed by the coating method is a polysilazane-type SOG film or an SOG film including porous silica.

* * * * *